(12) United States Patent
Lee

(10) Patent No.: US 9,177,953 B2
(45) Date of Patent: Nov. 3, 2015

(54) CIRCULAR SEMICONDUCTOR DEVICE WITH ELECTROSTATIC DISCHARGE (ESD) DEVICE AND FUNCTIONAL DEVICE

(71) Applicant: Taiwan Semiconductor Manufacturing Company Limited, Hsin-Chu (TW)

(72) Inventor: Jam-Wem Lee, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 53 days.

(21) Appl. No.: 14/069,285

(22) Filed: Oct. 31, 2013

(65) Prior Publication Data

US 2015/0115366 A1   Apr. 30, 2015

(51) Int. Cl.
*H01L 27/02* (2006.01)
(52) U.S. Cl.
CPC .................................. *H01L 27/0296* (2013.01)
(58) Field of Classification Search
USPC .............. 257/E29.327, E21.09, E21.368, 487
See application file for complete search history.

(56) References Cited

U.S. PATENT DOCUMENTS

| | | | |
|---|---|---|---|
| 6,844,593 B2 * | 1/2005 | Kikuchi et al. | 257/343 |
| 7,741,662 B2 | 6/2010 | Kao | |
| 8,288,822 B2 | 10/2012 | Shih et al. | |
| 8,390,096 B2 | 3/2013 | Hwang | |
| 2008/0006847 A1 | 1/2008 | Grombach et al. | |
| 2011/0241069 A1 * | 10/2011 | Vashchenko | 257/140 |
| 2012/0282762 A1 | 11/2012 | Zhu | |
| 2013/0093010 A1 | 4/2013 | Huang et al. | |

* cited by examiner

*Primary Examiner* — David Vu
*Assistant Examiner* — Jonathan Han
(74) *Attorney, Agent, or Firm* — Cooper Legal Group, LLC

(57) ABSTRACT

One or more semiconductor devices with an electrostatic discharge (ESD) device and a functional device in a circular arrangement are provided herein. The semiconductor device comprises a first circular sector, a second circular sector, and at least two disconnect regions disposed between the first circular sector and the second circular sector. The first circular sector comprises at least one ESD device. The second circular sector comprises at least one functional device. A single semiconductor device having a circular arrangement or configuration thus has an ESD device and a functional device.

20 Claims, 8 Drawing Sheets

CIRCULAR SEMICONDUCTOR DEVICE WITH ELECTROSTATIC DISCHARGE (ESD) DEVICE AND FUNCTIONAL DEVICE

BACKGROUND

Electrostatic discharge (ESD) is a sudden and unexpected voltage or current that transfers energy to a device. ESD is known to render a device less operable than desired, or inoperable altogether.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
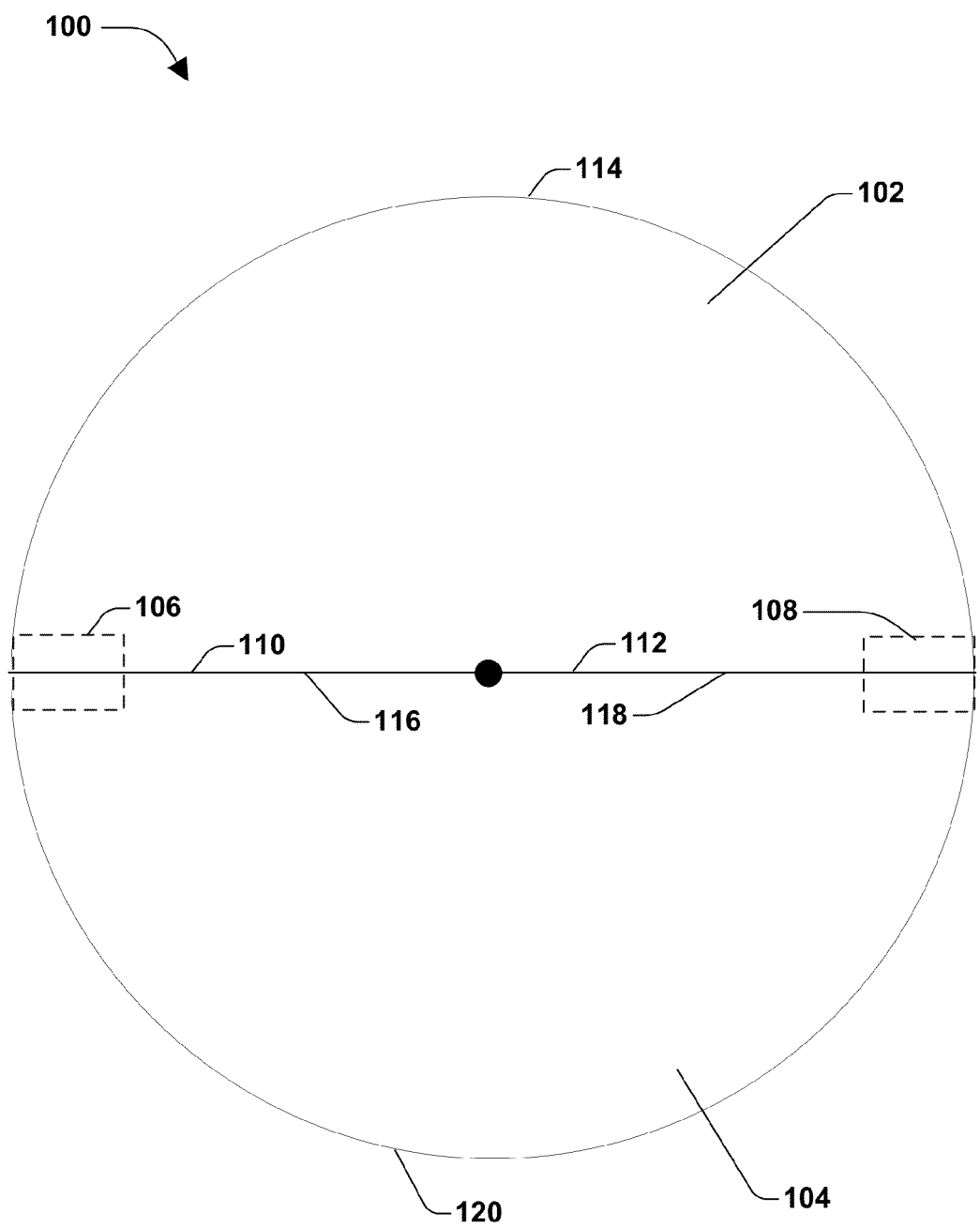
FIG. 1 is an illustration of a top view of a semiconductor device according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more semiconductor devices with an electrostatic discharge (ESD) device and a functional device in a circular arrangement are provided herein.

Figure 2:
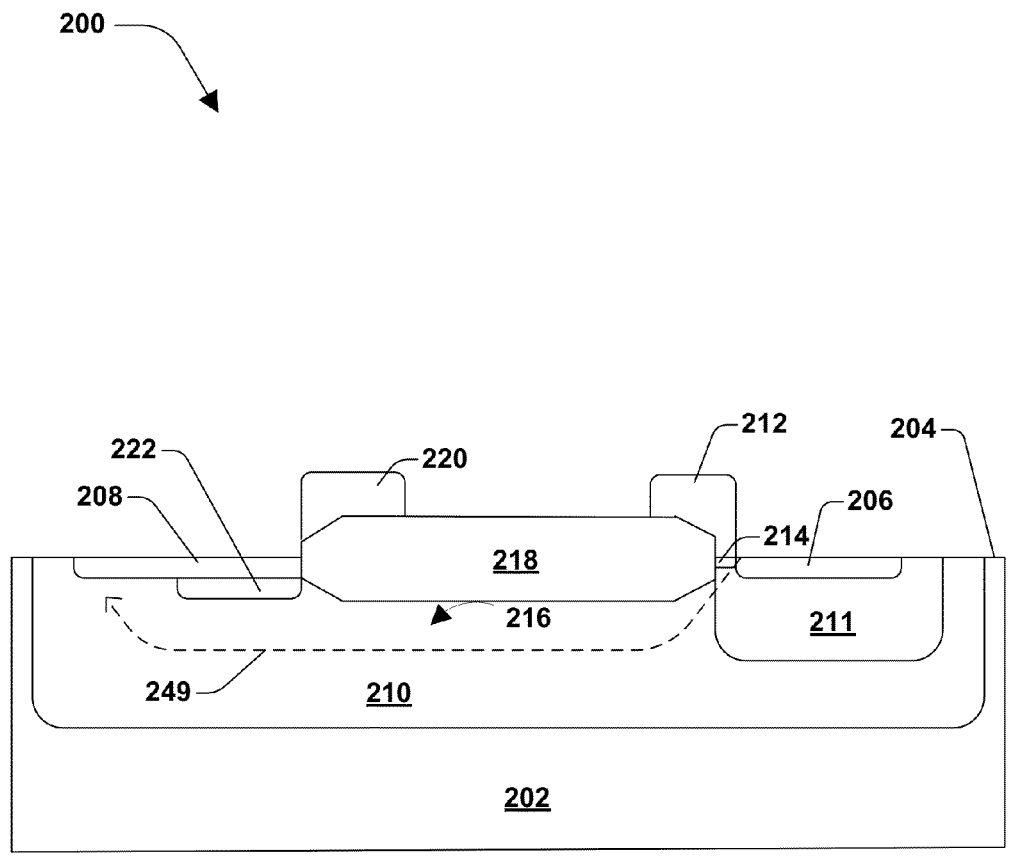
FIG. 2 is an illustration of a cross-sectional view of an ESD device according to some embodiments.
Figure 3:
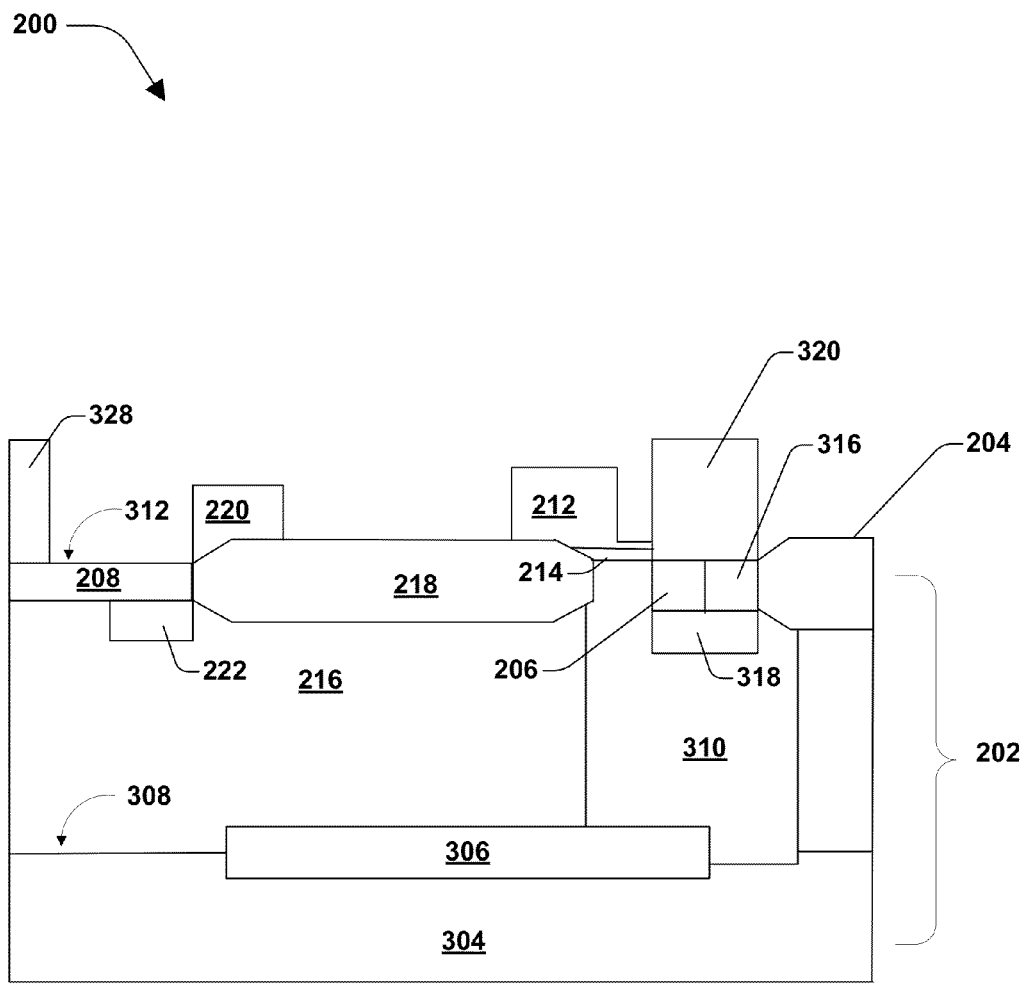
FIG. 3 is an illustration of a cross-sectional view of an ESD device according to some embodiments.
Figure 4:
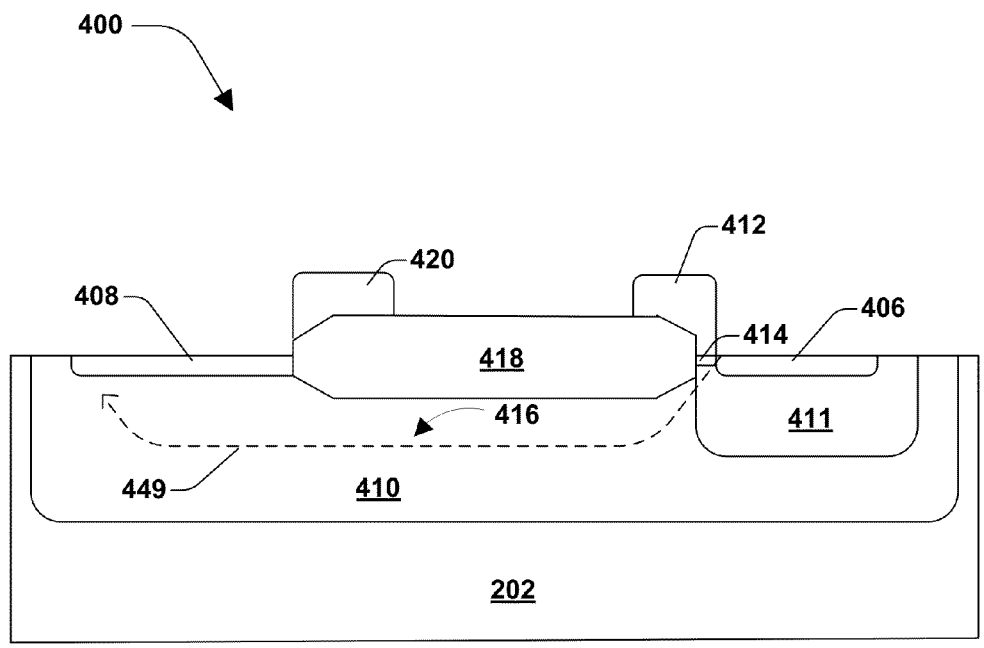
FIG. 4 is an illustration of a cross-sectional view of a functional device according to some embodiments.
Figure 5:
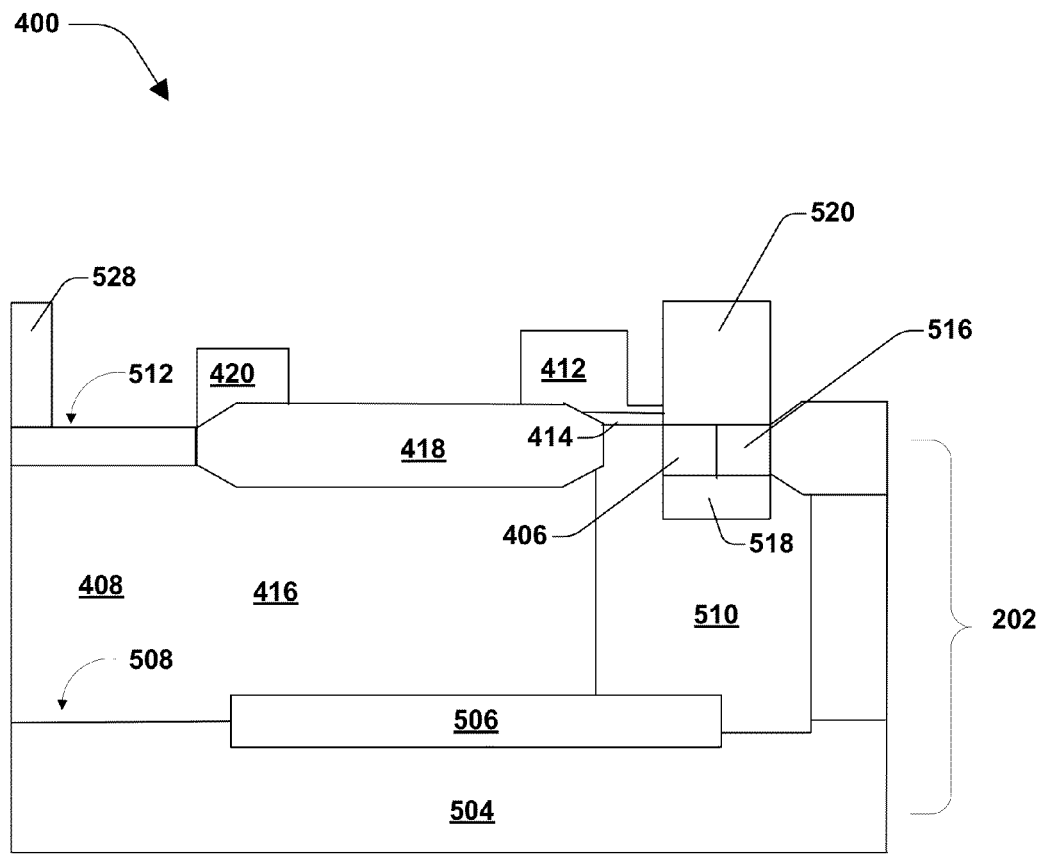
FIG. 5 is an illustration of a cross-sectional view of a functional device according to some embodiments.

Turning now to FIG. 1, a top view of a semiconductor device 100 according to some embodiments is provided. In some embodiments, the semiconductor device 100 includes an ultrahigh voltage MOSFET. In some embodiments, the semiconductor device 100 has a circular configuration. In some embodiments, the semiconductor device 100 includes at least one of a first circular sector 102, a second circular sector 104, a first disconnect region 106 or a second disconnect region 108. In some embodiments, the first circular sector 102 is defined by at least one of a first radius 110, a second radius 112 or a first arc 114 connected there between. In some embodiments, the second circular sector 104 is defined by at least one of a third radius 116, a fourth radius 118 or a second arc 120 connected there between. In some embodiments, at least one of the first radius 110 or the second radius 112 overlap with at least one of the third radius 116 or the forth radius 118. In some embodiments, at least one of the first circular sector 102 or the second circular sector 104 includes a semi-circle. In some embodiments, at least one of the first circular sector 102 or the second circular sector 104 is larger than the other of the first circular sector 102 or the second circular sector 104. In some embodiments, at least one of the first circular sector 102 or the second circular sector 104 includes at least one of a first ESD device 200, such as illustrated in FIG. 2 or FIG. 3, or a first functional device 400, such as illustrated in FIG. 4 or FIG. 5. In some embodiments, the first circular sector 102 includes the first ESD device 200. In some embodiments, the first ESD device 200 reduces electrostatic discharge in the semiconductor device 100. In some embodiments, the second circular sector 104 includes the first functional device 400. In some embodiments, the first functional device 400 includes a larger safe operation area (SOA) as compared to the first ESD device 200. In some embodiments, the first functional device 400 has an SOA of more than 800 volts. In some embodiments, the first disconnect region 106 is disposed between the first radius 110 of the first circular sector 102 and the third radius 116 of the second circular sector 104. In some embodiments, the second disconnect region 108 is disposed between the second radius 112 of the first circular sector 102 and the fourth radius 118 of the second circular sector 104. In some embodiments, at least one of the first disconnect region 106 or the second disconnect region 108 separates at least a portion of the first ESD device 200 from at least a portion of the first functional device 400.

Turning now to FIG. 2, a cross-sectional view of the first ESD device 200 according to some embodiments is provided. In some embodiments, the first ESD device 200 is formed on a semiconductor substrate 202. In some embodiments, the first ESD device 200 includes at least one of a first source region 206 or a first central drain region 208. In some embodiments, the first source region 206 and first central drain region 208 have a first doping type. In some embodiments, the first source region 206 and first central drain region 208 are doped with at least one of an n-type or p-type dopant. In some embodiments, the first ESD device 200 includes at least one of a first well region 210 and a second well region 211. In some embodiments, the first well region 210 includes the first doping type and a second well region 211 includes a second doping type that is opposite of the first doping type. In some embodiments, the first ESD device 200 includes at least one of a deep well or a buried well. In some embodiments, the first ESD device 200 includes a first gate region 212. In some embodiments, the first gate region 212 includes at least one of a polysilicon or a metal. In some embodiments, a first gate dielectric 214 is sandwiched between the first gate region 212 and the second well region 211 to provide electrical isolation. In some embodiments, a first drain extension region 216 is disposed in the semiconductor substrate 202 between the second well region 211 and the first central drain region 208. In some embodiments, the first drain extension region 216 includes the first doping type. In some embodiments, a first field oxide region 218 is disposed over the first drain extension region 216. In some embodiments, the first field oxide region 218 has a thickness that is greater than a thickness of the first gate dielectric 214. In some embodiments, a first field plate region 220 is disposed over a portion of the first field oxide region 218 near the first central drain region 208. In some embodiments, the first field plate region 220 includes at least one of a poly or a metal. In some embodiments, a current diversion region 222 is disposed in the substrate 202 near the substrate surface 204 between the drain extension region 216 and the first central drain region 208. In some embodiments, the current diversion region 222 includes at least one of the second conductivity type or an intrinsic carrier concentration of the substrate to divert current. In some embodiments, the current diversion region 222 includes a non-silicide region that is electrically floating.

In some embodiments, the first ESD device 200 is in an on-state or an off-state, depending on a bias applied to the first ESD device 200. In some embodiments, the on-state includes a low-resistance state between the first source region 206 and the first central drain region 208 and the off-state includes a high-resistance state between the first source region 206 and the first central drain region 208. In some embodiments, a gate voltage greater than a predetermined voltage threshold ($V_{Th}$) is applied to the first gate region 212 relative to the first source region 206 to initiate the on-state. In some embodiments, the relatively high gate-to-source voltage ($V_{GS}$) forms a depletion region in the second well 211 under the gate region 212. In some embodiments, the depletion causes a majority carrier or electron from the first source region 206 to flow into the depletion region, thereby creating a channel region with a high concentration of mobile majority carriers or electrons. In some embodiments, a voltage bias applied between the first source region 206 and first central drain region 208 causes the mobile carriers or electrons in the channel region to drift through the drain extension region 216 and into the first central drain region 208, as indicated by arrow 249. In some embodiments, to achieve an off-state, $V_{is}$ is driven lower than $V_{TH}$. In some embodiments, when the first ESD device 200 is in an off-state, few or no mobile carriers or electrons are present in the channel region and a high-resistance is seen between the first source region 206 and the first central drain region 208.

In some embodiments, the majority carriers or electrons more easily go around the current diversion region 222 than go through it because the current diversion region 222 includes substrate material having the second conductivity type, which is opposite the first conductivity of the drain extension region 216. In some embodiments, the current diversion region 222 includes a large energetic barrier, relative to the surrounding first well 210.

Turning now to FIG. 3, a cross-sectional view of the first ESD device 200 according to some embodiments is provided. In some embodiments, the first ESD device 200 is formed on the substrate 202. In some embodiments, the substrate 202 includes at least one of a silicon wafer or silicon-on-insulator (SOI) wafer. In some embodiments, the substrate 202 includes a first buried n-region 304. In some embodiments, the first buried n-region 304 includes an n-doped wafer. In some embodiments, a first deep p-well 306 is formed over the first buried n-well 304. In some embodiments, the first deep p-well 306 extends laterally near a first top surface 308 of the first buried n-well 304. In some embodiments, a first p-well 310 extends from near a first upper substrate surface 312 down to the first deep p-well 306. In some embodiments, the first p-well 310 extends laterally under the first gate region 212.

In some embodiments, the first ESD device 200 includes at least one of a first highly doped surface implant region 316 or a first deeper and lesser doped implant region 318. In some embodiments, at least one of the first highly doped surface implant region 316 or the first deeper and lesser doped implant region 318 provide an ohmic contact between a first source/body contact 320 and the first p-well 310. In some embodiments, the first source/body contact 320 includes at least one of a polysilicon or a metal. In some embodiments, the metal includes at least one of tungsten, aluminum or copper. In some embodiments, the first source/body contact 320 is electrically coupled to the first source region 206. In some embodiments, the first source region 206 includes a highly doped n-type region. In some embodiments, the first source region 206 is formed in the first p-well 310 near the first upper substrate surface 312. In some embodiments, the first source region 206 is self-aligned with the first gate region 212.

In some embodiments, the first drain extension region 216 includes a high-voltage n-well. In some embodiments, the first drain extension region 216 dissipates large voltages over the first ESD device 200. In some embodiments, the first drain extension region 216 laterally abuts the first p-well 310 on one side.

In some embodiments, the first central drain region 208 includes a highly doped n-type region. In some embodiments, a first drain contact 328 is coupled to the first central drain region 208. In some embodiments, the first drain contact 328 includes at least one of a polysilicon or metal. In some embodiments, the first drain contact 328 includes at least one of tungsten, aluminum or copper.

In some embodiments, the first field oxide region 218 abuts the gate dielectric region 214. In some embodiments, the first field oxide region 218 is disposed between the first source region 206 and the first central drain region 208. In some embodiments, at least one of the first gate dielectric 214 and first field oxide region 218 includes silicon dioxide.

In some embodiments, the current diversion region 222 includes a p-type region. In some embodiments, the current diversion region 222 is disposed adjacent to the first central drain region 208 and the first drain extension region 216. In some embodiments, the polarities of the illustrated doping types for the first ESD device 200 are reversed.

Turning now to FIG. 4, a cross-sectional view of the first functional device 400 according to some embodiments is provided. In some embodiments, the functional device 400 is similar to the first ESD device 200 without the inclusion of a current diversion region. In some embodiments, the first functional device 400 is formed on the semiconductor substrate 202. In some embodiments, the first functional device 400 includes at least one of a second source region 406 or a second central drain region 408. In some embodiments, the second source region 406 and second central drain region 408 have a first doping type. In some embodiments, the second source region 406 and second central drain region 408 are doped with at least one of an n-type or p-type dopant. In some embodiments, the second central drain region 408 is a highly doped n-type region. In some embodiments, first functional device 400 includes a third well region 410 and a forth well region 411. In some embodiments, the third well region 410 has the first doping type and a fourth well region 411 has a second doping type that is opposite of the first doping type. In some embodiments, the functional device 400 includes a second gate region 412. In some embodiments, the second gate region 412 includes at least one of a polysilicon or metal. In some embodiments, a second gate dielectric 414 is sandwiched between the second gate region 412 and the second well region 411 to provide electrical isolation. In some embodiments, a second drain extension region 416 is disposed in the semiconductor substrate 202 between the second well region 411 and the second central drain region 408. In some embodiments, the second drain extension region 416 includes the first doping type. In some embodiments, a second field oxide region 418 is disposed over the second drain extension region 416. In some embodiments, the second field oxide region 418 has a thickness that is greater than a thickness of the second gate dielectric 414. In some embodiments, a second field plate region 420 is disposed over a portion of the second field oxide region 418 near the second central drain region 408. In some embodiments, the second field plate region 420 includes a poly or a metal.

In some embodiments, a voltage bias applied between the second source region 406 and second central drain region 408 causes the mobile carriers or electrons in a channel region to drift through the drain extension region 416 and into the first central drain region 408, as indicated by arrow 449.

Turning now to FIG. 5, a cross-sectional view of the first functional device 400 according to some embodiments is provided. In some embodiments, the functional device 400 is similar to the first ESD device 200 without the inclusion of a current diversion region. In some embodiments, the first functional device 400 is formed on the substrate 202. In some embodiments, a second deep p-well 506 is formed over a second buried n-well 504. In some embodiments, the second deep p-well 506 extends laterally near a second top surface 508 of the second buried n-well 504. In some embodiments, a second p-well 510 extends from near a second upper substrate surface 512 down to the second deep p-well 506. In some embodiments, the second p-well 510 extends laterally under the second gate region 412. In some embodiments, the first functional device 400 includes at least one of a second highly doped surface implant region 516 or a second deeper and lesser doped implant region 518. In some embodiments, at least one of the second highly doped surface implant region 516 or the second deeper and lesser doped implant region 518 provide an ohmic contact between a second source/body contact 520 and the second p-well 510. In some embodiments, a second drain contact 528 is coupled to the second central drain region 408.

In some embodiments, the second field oxide region 418 abuts the second gate dielectric region 414. In some embodiments, the second field oxide region 418 is disposed between the second source region 406 and the second central drain region 408. In some embodiments, the second source region 406 includes a highly doped n-type region. In some embodiments, the second drain extension region 416 includes a high-voltage n-well. In some embodiments, the polarities of the illustrated doping types for the first functional device 400 are reversed.

Figure 6:
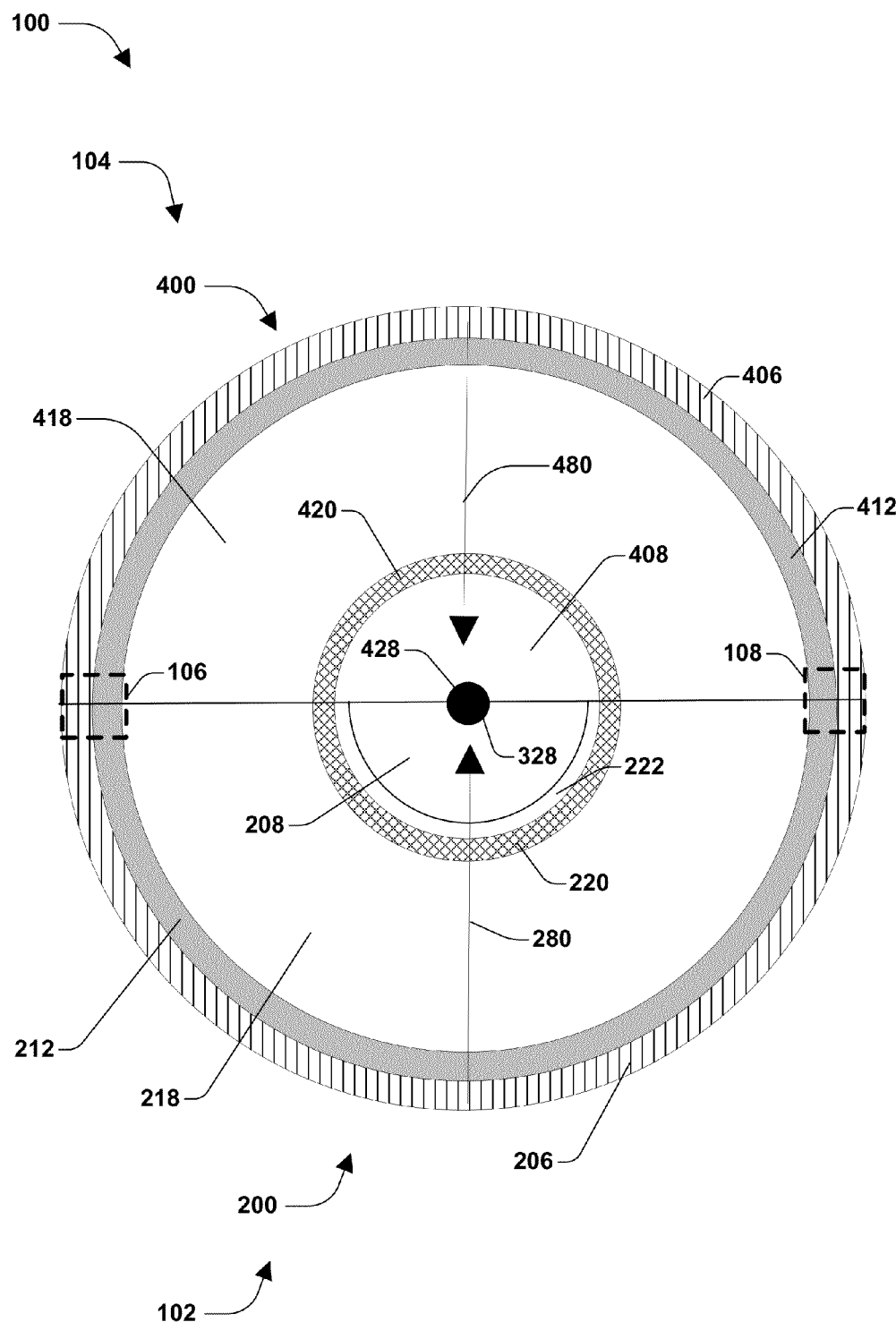
FIG. 6 is an illustration of a top view of a semiconductor device according to some embodiments.

Turning now to FIG. 6, a top view of the semiconductor device 100 according to some embodiments is provided. In some embodiments, the semiconductor device 100 has a circular configuration. In some embodiments, the semiconductor device 100 includes a diameter of about 200 to about 300 micrometers. In some embodiments, the semiconductor device 100 includes at least a first circular sector 102 or a second circular sector 104. In some embodiments, the first circular sector 102 includes the first ESD device 200. In some embodiments, the second circular sector 104 includes the first functional device 400.

In some embodiments, the first source region 206 defines the outer perimeter of the first ESD device 200. In some embodiments, the first central drain region 208 is spaced apart from the first source region 206. In some embodiments, the first central drain region 208 and the first source region 206 include a first conductivity type. In some embodiments, the first central drain region 208 includes a first drain contact 328. In some embodiments, the first field oxide region 218 is between the first source region 206 and the first central drain region 208. In some embodiments, the first gate region 212 is between the first field oxide region 218 and the first source region 206. In some embodiments, the first field plate region 220 is between the first field oxide region 218 and the first central drain region 208. In some embodiments, the current diversion region 222 is disposed near the first central drain region 208. In some embodiments, the current diversion region 222 is disposed in the substrate 202. In some embodiments, the current diversion region 222 includes a second conductivity type opposite the first conductivity type and configured to inhibit current crowing at the central drain region. In some embodiments, at least one of the first source region 206, the first central drain region 208, the first field oxide region 218, the first field plate region 220 or the first gate region 212 are disposed over the substrate 202. In some embodiments, during operation current flows from the first source region 206 under the first gate region 212 and to the first central drain region 208, as illustrated by arrow 280, based on the bias applied.

In some embodiments, the second source region 406 defines the outer perimeter of the first functional device 400. In some embodiments, the second central drain region 408 is spaced apart from the second source region 406. In some embodiments, the second central drain region 408 and the second source region 406 include a first conductivity type. In some embodiments, the second central drain region 408 includes a second drain contact 428. In some embodiments, the second field oxide region 418 is between the second source region 406 and the second central drain region 408. In some embodiments, the second gate region 412 is between the second field oxide region 418 and the second source region 406. In some embodiments, the second field plate region 420 is between the second field oxide region 418 and the second central drain region 408. In some embodiments, at least one of the second source region 406, the second central drain region 408, the second field oxide region 418, the second field plate region 420 or the second gate region 412 are disposed over the substrate 202. In some embodiments, during operation current flows from the second source region 406 under the second gate region 412 and to the second central drain region 408, as illustrated by arrow 480, based on the bias applied.

In some embodiments, at least one of the first disconnect region 106 or the second disconnect region 108 separate the first ESD device 200 from the first functional device 400. In some embodiments, at least one of the first disconnect region 106 or the second disconnect region 108 include at least one of a gap or a non-conductive material. In some embodiments, the gap is at least one of between the first source region 206 and the second source region 406 or between the first gate region 212 and the second gate region 412.

In some embodiments, at least one of the first source region 206, the first central drain region 208, the first field oxide region 218, the first field plate region 220 or the first gate region 212 contacts at least one of the second source region 406, the second central drain region 408, the second field oxide region 418, the second field plate region 420 or the second gate region 412, respectively, to form a continuous ring shaped region.

Figure 7:
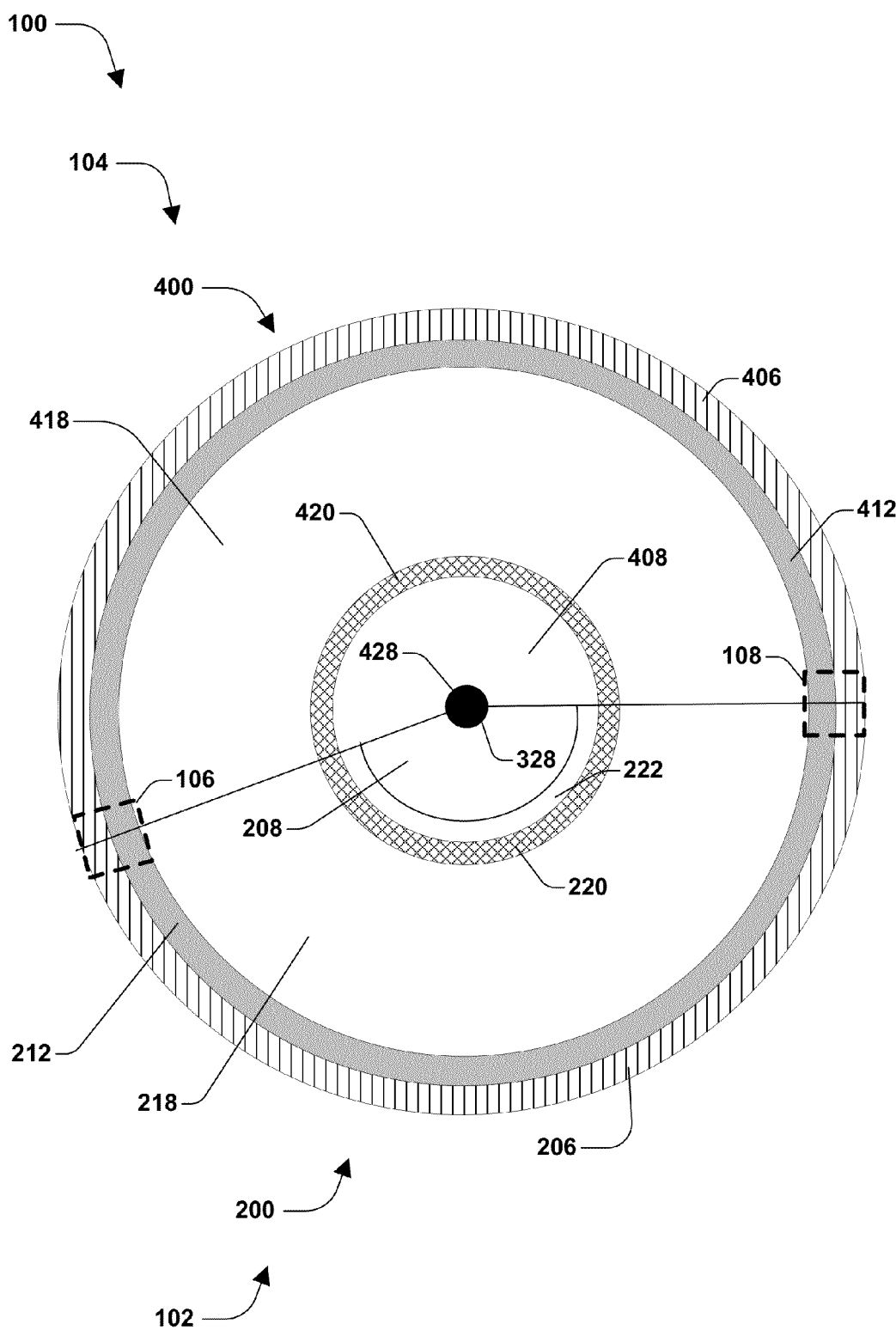
FIG. 7 is an illustration of a top view of a semiconductor device according to some embodiments.

Turning to FIG. 7, a top view of the semiconductor device 100 according to some embodiments is provided. In some embodiments, the first circular sector 102 and the second circular sector 104 form a circle. In some embodiments, at least one of the first circular sector 102 or the second circular sector 104 occupies a greater area percentage of the circle than the other of the first circular sector 102 or the second circular sector 104. In some embodiments, the area of the first circular sector 102 corresponds to an ESD area of the first ESD device 200. In some embodiments, the area of the second circular sector 104 corresponds to a functional area of the first functional device 400. In some embodiments, the ESD area of the first ESD device is proportional to an ESD level of the semiconductor device 100. In some embodiments, the functional area of the first functional device is proportional to a driving current of the semiconductor device 100. In an embodiment, the semiconductor device 100 is configurable for obtaining a desired or optimal circuit performance and ESD robustness based on the area of at least one of the first ESD device 200 or the first functional device 400.

Figure 8:
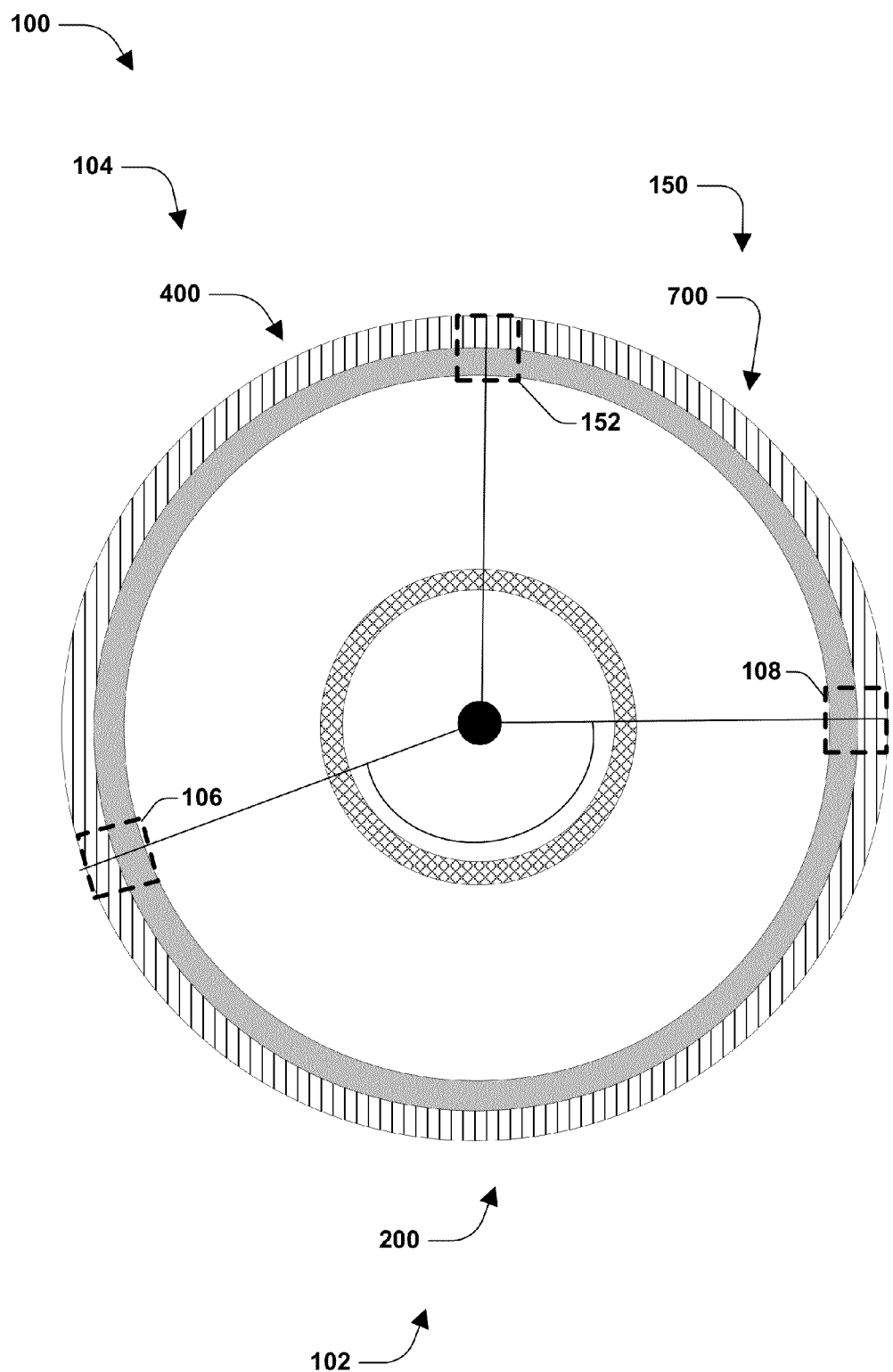
FIG. 8 is an illustration of a top view of a semiconductor device according to some embodiments.

Turning to FIG. 8, a top view of the semiconductor device 100 according to some embodiments is provided. In an embodiment, the semiconductor device 100 includes a third circular sector 150. In an embodiment, the third circular sector 150 includes a third device 700. In an embodiment, the third device includes at least one of a second ESD device or a second functional device. In an embodiment, at least one of the second ESD device or the second functional device is substantially similar to at least one of the first ESD device 200 or the first functional device 400 discussed above. In an embodiment, the semiconductor device 100 includes a third disconnect region 152. In an embodiment, the third disconnect region 152 is disposed between at least one of the first circular sector 102 and the third circular sector 150 or the second circular sector 104 and the third circular sector 150.

In some embodiments, a semiconductor device is provided. In some embodiments, the semiconductor device comprises a first circular sector defined by a first radius, a second radius and a first arc connected there between, a second circular sector defined by a third radius, a fourth radius and a second arc connected there between, a first disconnect region disposed between the first radius of the first circular sector and the third radius of the second circular sector and a second disconnect region disposed between the second radius of the first circular sector and the fourth radius of the second circular sector. In some embodiments, the first circular sector comprises a first ESD device. In some embodiments, the second circular sector comprises a first functional device.

In some embodiments, a semiconductor device having a circular configuration is provided. In some embodiments, the semiconductor device comprises a first circular sector defined by a first radius, a second radius and a first arc connected there between, a second circular sector defined by a third radius, a fourth radius and a second arc connected there between, a first disconnect region disposed between the first radius of the first circular sector and the third radius of the second circular sector and a second disconnect region disposed between the second radius of the first circular sector and the fourth radius of the second circular sector. In some embodiments, the first circular sector comprises a first ESD device. In some embodiments, the first ESD device comprises a first source region disposed over a substrate having a first conductivity type, a first central drain region disposed over the substrate having the first conductivity type, the first central drain region spaced apart from the first source region, a first field oxide region disposed over the substrate between the first source region and the first central drain region, a first gate region disposed over the substrate between the first field oxide region and the first source region and a current diversion region disposed in the substrate near the first central drain region, the current diversion region having a second conductivity type opposite the first conductivity type and configured to inhibit current crowding at the first central drain region. In some embodiments, the second circular sector comprises a first functional device. In some embodiments, the first functional device comprises a second source region disposed over a substrate, a second central drain region disposed over the substrate, the second central drain spaced apart from the second source region, a second field oxide region disposed over the substrate between the second source region and the second central drain region and a second gate region disposed over the substrate and disposed between the second field oxide region and the second source region.

In some embodiments, a semiconductor device having a circular configuration is provided. In some embodiments, the semiconductor device comprises a first circular sector defined by a first radius, a second radius and a first arc connected there between, a second circular sector defined by a third radius, a fourth radius and a second arc connected there between, a first disconnect region disposed between the first radius of the first circular sector and the third radius of the second circular sector and a second disconnect region disposed between the second radius of the first circular sector and the fourth radius of the second circular sector. In some embodiments, the first circular sector comprises a first ESD device. In some embodiments, the first ESD device comprises a first source region defining an outer perimeter of the first circular sector, a first gate region disposed adjacent the first source region and extending along an inner edge of the first source region, a first field oxide region disposed adjacent the gate region and extending along an inner edge of the first gate region, a first field plate region disposed adjacent the first field oxide region and extending along an inner edge of the first field oxide region, a current diversion region disposed adjacent the first field plate region and extending along an inner edge of the first field plate region and a first central drain region adjacent the current diversion region. In some embodiments, the second circular sector comprises a first functional device. In some embodiments, the first functional device comprises a second source region defining the outer perimeter of the semiconductor device, a second gate region disposed adjacent the second source region and extending along the inner edge of the second source region, a second field oxide region disposed adjacent the second gate region and extending along the inner edge of the second gate region, a second field plate region disposed adjacent the second field oxide region and extending along an inner edge of the second field oxide region and a second central drain region adjacent the second field plate region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
    a first circular sector defined by a first radius, a second radius and a first arc connected there between, the first circular sector comprising:
        a first electrostatic discharge (ESD) device comprising:
            a first source region; and
            a first central drain region;
    a second circular sector defined by a third radius, a fourth radius and a second arc connected there between, the second circular sector comprising:
        a first functional device comprising:
            a second source region; and
            a second central drain region in contact with the first central drain region; and
    a first disconnect region disposed between the first source region and the second source region.

2. The semiconductor device of claim 1, wherein:
    the first source region is disposed over a substrate and has a first conductivity type;
    the first central drain region is disposed over the substrate and has the first conductivity type; and
    the first ESD device comprises:
        a first field oxide region disposed over the substrate between the first source region and the first central drain region;
        a first gate region disposed over the substrate between the first field oxide region and the first source region; and
        a current diversion region disposed in the substrate near the first central drain region, the current diversion region having a second conductivity type opposite the first conductivity type and configured to inhibit current crowding at the first central drain region.

3. The semiconductor device of claim 1, wherein:
    the second source region is disposed over a substrate;
    the second central drain region is disposed over the substrate, the second central drain region spaced apart from the second source region; and
    the first functional device comprises:
        a second field oxide region disposed over the substrate between the second source region and the second central drain region; and
        a second gate region disposed over the substrate between the second field oxide region and the second source region.

4. The semiconductor device of claim 1, wherein the first circular sector and the second circular sector form a circle.

5. The semiconductor device of claim 1, wherein the first disconnect region defines a gap between the first source region and the second source region.

6. The semiconductor device of claim 1, comprising a third circular sector comprising at least one of a second ESD device or a second functional device.

7. The semiconductor device of claim 1, comprising an ultrahigh voltage MOSFET.

8. A semiconductor device having a circular configuration, the semiconductor device comprising:
    a first circular sector defined by a first radius, a second radius and a first arc connected there between, the first circular sector comprising:
        a first electrostatic discharge (ESD) device, the first ESD device comprising:
            a first source region disposed over a substrate and having a first conductivity type;
            a first central drain region disposed over the substrate and having the first conductivity type, the first central drain region spaced apart from the first source region;
            a first field oxide region disposed over the substrate between the first source region and the first central drain region;
            a first gate region disposed over the substrate between the first field oxide region and the first source region; and
            a current diversion region disposed in the substrate near the first central drain region, the current diversion region having a second conductivity type opposite the first conductivity type and configured to inhibit current crowding at the first central drain region;
    a second circular sector defined by a third radius, a forth radius and a second arc connected there between, the second circular sector comprising:
        a first functional device, the first functional device comprising:
            a second source region disposed over the substrate;
            a second central drain region disposed over the substrate, the second central drain region spaced apart from the second source region;
            a second field oxide region disposed over the substrate between the second source region and the second central drain region; and a second gate region disposed over the substrate between the second field oxide region and the second source region;
a first disconnect region disposed between the first source region and the second source region; and
a second disconnect region disposed between the first source region and the second source region, wherein:
the first source region and second source region form a substantially cylindrical shape having a circumference, the first disconnect region disposed at a first location along the circumference and the second disconnect region disposed at a second location along the circumference.

9. The semiconductor device of claim 8, wherein the first circular sector and the second circular sector form a circle.

10. The semiconductor device of claim 8, at least one of the first disconnect region or the second disconnect region defining a gap between the first source region and the second source region.

11. The semiconductor device of claim 8, wherein the first functional device does not comprise any current diversion region near the second central drain region.

12. The semiconductor device of claim 8, wherein at least one of the first disconnect region or the second disconnect region is disposed between the first gate region and the second gate region.

13. The semiconductor device of claim 8, wherein the first central drain region contacts the second central drain region.

14. The semiconductor device of claim 9, wherein at least one of the first circular sector or the second circular sector occupies a greater area percentage of the circle than the other.

15. The semiconductor device of claim 8, wherein an ESD area of the first ESD device is proportional to an ESD level of the semiconductor device and a functional area of the first functional device is proportional to a driving current of the semiconductor device.

16. The semiconductor device of claim 8, comprising a third circular sector and a third disconnect region, the third circular sector comprising at least one of a second ESD device or a second functional device.

17. The semiconductor device of claim 8, comprising an ultrahigh voltage MOSFET.

18. A semiconductor device having a circular configuration, the semiconductor device comprising:
a first circular sector defined by a first radius, a second radius and an arc connected there between, the first circular sector comprising:
a first electrostatic discharge (ESD) device; the first ESD device comprising:
a first source region defining an outer perimeter of the first circular sector;
a first gate region disposed adjacent the first source region and extending along an inner edge of the first source region;
a first field oxide region disposed adjacent the first gate region and extending along an inner edge of the first gate region;
a first field plate region disposed adjacent the first field oxide region and extending along an inner edge of the first field oxide region;
a current diversion region disposed adjacent the first field plate region and extending along an inner edge of the first field plate region; and
a first central drain region adjacent the current diversion region;
a second circular sector defined by a third radius, a forth radius and a second arc connected there between, the second circular sector comprising:
a first functional device, the first functional device comprising:
a second source region defining the outer perimeter of the semiconductor device;
a second gate region disposed adjacent the second source region and extending along an inner edge of the second source region;
a second field oxide region disposed adjacent the second gate region and extending along an inner edge of the second gate region;
a second field plate region disposed adjacent the second field oxide region and extending along an inner edge of the second field oxide region; and
a second central drain region adjacent the second field plate region;
a first disconnect region disposed between the first source region and the second source region; and
a second disconnect region disposed between the first source region and the second source region, wherein:
the first source region and the second source region define at least a portion of a circumference of the semiconductor device, the first disconnect region disposed at a first location along the circumference and the second disconnect region disposed at a second location along the circumference.

19. The semiconductor device of claim 18, wherein an ESD area of the first ESD device is proportional to an ESD level of the semiconductor device and a functional area of the first functional device is proportional to a driving current of the semiconductor device.

20. The semiconductor device of claim 18, comprising a third circular sector and a third disconnect region, the third circular sector comprising at least one of a second ESD device or a second functional device.

* * * * *